US009955093B2

(12) United States Patent
Kamimurai et al.

(10) Patent No.: US 9,955,093 B2
(45) Date of Patent: Apr. 24, 2018

(54) SWITCH CONTROL CIRCUIT, SEMICONDUCTOR APPARATUS, AND MAGNETIC INK READING APPARATUS

(71) Applicant: Mitsubishi Electric Corporation, Chiyoda-ku, Tokyo (JP)

(72) Inventors: Akio Kamimurai, Tokyo (JP); Takayuki Nakai, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 15/503,179

(22) PCT Filed: Sep. 29, 2014

(86) PCT No.: PCT/JP2014/075943
§ 371 (c)(1),
(2) Date: Feb. 10, 2017

(87) PCT Pub. No.: WO2016/051475
PCT Pub. Date: Apr. 7, 2016

(65) Prior Publication Data
US 2017/0251155 A1    Aug. 31, 2017

(51) Int. Cl.
*G06F 7/38*     (2006.01)
*H04N 5/369*    (2011.01)
*H04N 3/14*     (2006.01)
*H04N 5/335*    (2011.01)
*H04L 7/02*     (2006.01)
*H02M 7/48*     (2007.01)
*H02M 7/5387*   (2007.01)
*H02M 1/00*     (2006.01)

(52) U.S. Cl.
CPC .............. *H04N 5/369* (2013.01); *H02M 7/48* (2013.01); *H02M 7/5387* (2013.01); *H04L 7/02* (2013.01);
(Continued)

(58) Field of Classification Search
CPC .......... H04N 5/369; H04N 3/14; H04N 5/335; H02M 7/48; H02M 7/5387; H02M 2001/0054; H04L 7/02
(Continued)

(56) References Cited
U.S. PATENT DOCUMENTS
2001/0030705 A1* 10/2001 Ogawa .................. H04N 5/335
348/311

FOREIGN PATENT DOCUMENTS
JP    60-197079 A    10/1985
JP    61-84765 A     5/1986
(Continued)

OTHER PUBLICATIONS
International Search Report (PCT/ISA/210) dated Dec. 22, 2014, by the Japanese Patent Office as the International Searching Authority for International Application No. PCT/JP2014/075943.
(Continued)

Primary Examiner — Daniel D Chang
(74) Attorney, Agent, or Firm — Buchanan Ingersoll & Rooney PC

(57) ABSTRACT

A first flip-flop outputs a first output signal as a first switch signal that controls a first switch. A second flip-flop outputs a second output signal based on a clock signal and the first output signal. A first inverting circuit generates a first inverted signal obtained by inverting the first output signal. A second AND circuit outputs a signal that is an AND of the first inverted signal and the second output signal, as a second switch signal that controls a second switch.

6 Claims, 6 Drawing Sheets

(52) U.S. Cl.
CPC ............... *H04N 3/14* (2013.01); *H04N 5/335* (2013.01); *H02M 2001/0054* (2013.01)

(58) Field of Classification Search
USPC ...................................... 326/40, 46
See application file for complete search history.

(56) References Cited

FOREIGN PATENT DOCUMENTS

| | | |
|---|---|---|
| JP | 61-148957 A | 7/1986 |
| JP | 5-241536 A | 9/1993 |
| JP | 9-212133 A | 8/1997 |
| JP | 10-39275 A | 2/1998 |
| JP | 2005-217708 A | 8/2005 |
| JP | 2005-228895 A | 8/2005 |
| JP | 2005-235810 A | 9/2005 |
| JP | 2010-134579 A | 6/2010 |

OTHER PUBLICATIONS

Japanese Office Action dated October 24, 2017 issued in corresponding Japanese Patent Application 2016-551362, along with the English-language machine translation (9 pages).

Japanese Office Action dated Jan. 9, 2018 issued in related Japanese Patent Application 2016-551362, with Machine Translation (8 pages).

* cited by examiner

SWITCH CONTROL CIRCUIT, SEMICONDUCTOR APPARATUS, AND MAGNETIC INK READING APPARATUS

TECHNICAL FIELD

The present invention relates to a technique for controlling a plurality of switches such that the plurality of switches do not simultaneously go into an on state.

BACKGROUND ART

In a plurality of flip-flops that compose a shift register, in order that clock signals which are input to the respective flip-flops are synchronized with each other, P&R is performed using a layout tool. P&R is an abbreviation for Place and Route.

When the layout tool is used, multiple buffers are inserted into clock signal lines, and thus, area efficiency is degraded.

Patent Literature 1 discloses a solid-state imaging apparatus that uses a master-slave shift register as a drive circuit.

Patent Literature 2 discloses a solid-state imaging device composed of a switch array and optical sensors connected to respective switches.

Patent Literature 3 discloses a multi-sensor-signal reading circuit that performs a chronological read on two sensors out of a plurality of sensors.

Patent Literature 4 discloses an image reading apparatus capable of performing image read operation with high reliability even when a subject directly contacts a detection surface.

Patent Literature 5 discloses a transistor array and an image processing apparatus to which a transistor array is applied.

Patent Literature 6 discloses the device structures of driver circuits in an image reading apparatus.

CITATION LIST

Patent Literature

Patent Literature 1: JP 60-197079 A
Patent Literature 2: JP 61-087465 A
Patent Literature 3: JP 61-148957 A
Patent Literature 4: JP 2005-217708 A
Patent Literature 5: JP 2005-228895 A
Patent Literature 6: JP 2005-235810 A

SUMMARY OF INVENTION

Technical Problem

An object of the present invention is to allow to control a plurality of switches such that the plurality of switches do not simultaneously go into an on state.

Solution to Problem

A switch control circuit according to the present invention includes:
a first switch;
a second switch;
a first flip-flop to output a first output signal as a first switch signal, the first switch signal controlling the first switch;
a second flip-flop to accept, as input, a clock signal and the first output signal and output a second output signal based on a signal value of the input clock signal and a signal value of the input first output signal; and
a second AND circuit to accept, as input, a first inverted signal and the second output signal and output, as a second switch signal, a signal representing a signal value that is an AND of a signal value of the input first inverted signal and a signal value of the input second output signal, the first inverted signal representing a signal value obtained by inverting the signal value of the first output signal, and the second switch signal controlling the second switch.

Advantageous Effects of Invention

According to the present invention, a plurality of switches can be controlled such that the plurality of switches do not simultaneously go into an on state.

DESCRIPTION OF EMBODIMENTS

First Embodiment

A mode will be described in which a plurality of switches are controlled such that the plurality of switches do not simultaneously go into an on state.

*Description of a Configuration*

Figure 1:
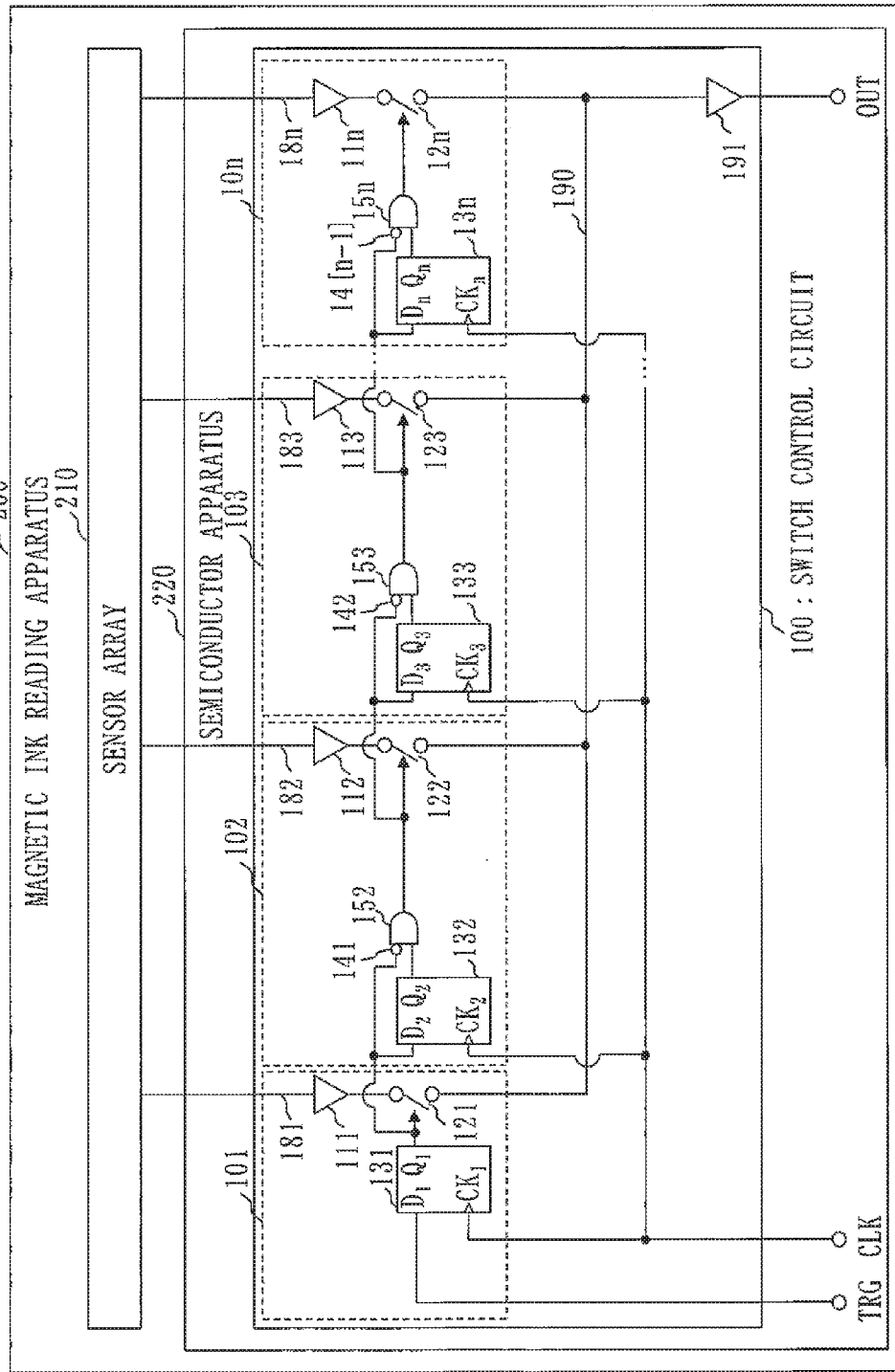
FIG. 1 is a configuration diagram of a magnetic ink reading apparatus 200 of a first embodiment.

FIG. 1 is a configuration diagram of a magnetic ink reading apparatus 200 of a first embodiment.

A configuration of the magnetic ink reading apparatus 200 of the first embodiment will be described based on FIG. 1. Note, however, that the configuration of the magnetic ink reading apparatus 200 does not need to be the same as that shown in FIG. 1.

The magnetic ink reading apparatus 200 includes a sensor array 210 and a semiconductor apparatus 220, and the semiconductor apparatus 220 includes a switch control circuit 100. That is, the magnetic ink reading apparatus 200 includes the switch control circuit 100.

The magnetic ink reading apparatus 200 detects magnetic ink from an object coated with magnetic ink. The magnetic ink is ink containing a magnetized magnetic material. For example, the magnetic ink reading apparatus 200 detects magnetic ink from a bill that is printed using magnetic ink.

The magnetic ink reading apparatus 200 is an example of an electronic device including the switch control circuit 100. The switch control circuit 100 may be used in other electronic devices than the magnetic ink reading apparatus 200.

The sensor array 210 includes a plurality of sensors arranged. The sensors included in the sensor array 210 are magnetic ink detection sensors that detect magnetic ink. Note, however, that the sensor array 210 may include sensors other than the magnetic ink detection sensors.

The sensor array 210 inputs sensor signals which are output from the respective sensors, to the switch control circuit 100, as individual signals to be output one by one in turn by the switch control circuit 100. That is, the sensor array 210 inputs a plurality of individual signals to the switch control circuit 100.

The sensor array 210 is an example of a multi-signal circuit that inputs a plurality of individual signals to the switch control circuit 100. The switch control circuit 100 may accept, as input, a plurality of individual signals from a multi-signal circuit other than the sensor array 210.

The semiconductor apparatus 220 includes the switch control circuit 100. The semiconductor apparatus 220 includes a trigger terminal TRG, a clock terminal CLK, and an output terminal OUT. The semiconductor apparatus 220 is also referred to as a semiconductor integrated circuit.

The trigger terminal TRG is a terminal to which a trigger signal is input. The trigger signal is a signal that instructs to start the output of an individual signal.

The clock terminal CLK is a terminal to which a clock signal is input. The clock signal is a signal with a fixed cycle where a high-voltage state and a low-voltage state are periodically repeated.

The output terminal OUT is a terminal from which individual signals are output one by one in turn. The individual signals output from the output terminal OUT are referred to as output individual signals.

For the clock signal, the trigger signal, or other signals, the state of a signal with a high voltage is referred to as a high state, and the state of a signal with a low voltage is referred to as a low state. For example, the signal value of a high-state signal is represented by 1 and the signal value of a low-state signal is represented by 0.

The switch control circuit 100 outputs the individual signals which are input from the sensor array 210, one by one in turn by controlling a plurality of switches.

The switch control circuit 100 performs control such that any one of the plurality of switches is placed in an on state and other switches are placed in an off state.

The switch control circuit 100 is also referred to as a channel selection control circuit. The channel selection control circuit is a circuit that selects a channel to output a signal from a plurality of channels. The channel is a signal path through which a signal flows.

The switch control circuit 100 includes a plurality of switches including a first switch 121, a second switch 122, and a third switch 123. Note, however, that the plurality of switches included in the switch control circuit 100 may be two switches: the first switch 121 and the second switch 122.

The switch control circuit 100 includes a plurality of flip-flops including a first flip-flop 131, a second flip-flop 132, and a third flip-flop 133. The plurality of flip-flops compose a shift register.

Note, however, that when the plurality of switches included in the switch control circuit 100 are two switches: the first switch 121 and the second switch 122, the plurality of flip-flops included in the switch control circuit 100 are two flip-flops: the first flip-flop 131 and the second flip-flop 132.

The first flip-flop 131 accepts, as input, a trigger signal and a clock signal and outputs a first output signal based on a signal value of the input trigger signal and a signal value of the input clock signal. The first output signal functions as a first switch signal that controls the first switch 121.

The second flip-flop 132 accepts, as input, the clock signal and the first output signal and outputs a second output signal based on a signal value of the input clock signal and a signal value of the input first output signal.

The third flip-flop 133 accepts, as input, the clock signal and a second switch signal and outputs a third output signal based on a signal value of the input clock signal and a signal value of the input second switch signal.

An Nth flip-flop accepts, as input, the clock signal and an (N−1)th switch signal and outputs an Nth output signal based on a signal value of the input clock signal and a signal value of the input (N−1)th switch signal. In this description, N is an integer greater than or equal to 2.

Each flip-flop included in the switch control circuit 100 is a D-type flip-flop.

The D-type flip-flop includes a D terminal to which an input signal is input, a CK terminal to which a clock signal is input, and a Q terminal from which an output signal is output.

The D-type flip-flop stores a signal value of the input signal that is input at clock signal rise timing, and outputs an output signal representing the stored signal value. The clock signal rise timing is timing at which the state of the clock signal transitions from the low state to the high state.

In the switch control circuit 100, a D terminal, a CK terminal, and a Q terminal included in the Nth flip-flop are referred to as a $D_N$ terminal, a $CK_N$ terminal, and a $Q_N$ terminal. In this description, N is an integer greater than or equal to 1.

In the switch control circuit 100, an input signal to be input to the $D_1$ terminal of the first flip-flop 131 is the trigger signal. An input signal to be input to the $D_2$ terminal of the second flip-flop 132 is the first output signal which functions as the first switch signal. In addition, an input signal to be input to the Nth flip-flop is the (N−1)th switch signal. In this description, N is an integer greater than or equal to 3.

The switch control circuit 100 includes a plurality of inverting circuits including a first inverting circuit 141 and a second inverting circuit 142. Note, however, that when the plurality of switches included in the switch control circuit 100 are two switches: the first switch 121 and the second switch 122, the inverting circuit included in the switch control circuit 100 is one inverting circuit: the first inverting circuit 141. The inverting circuit is also referred to as an inverter circuit.

The first inverting circuit 141 accepts, as input, the first output signal and inverts a signal value of the first output signal. A signal representing a signal value obtained by inverting the signal value of the first output signal is referred to as a first inverted signal.

The second inverting circuit 142 accepts, as input, the second switch signal and inverts a signal value of the second switch signal. A signal representing a signal value obtained by inverting the signal value of the second switch signal is referred to as a second inverted signal.

An Nth inverting circuit accepts, as input, an Nth switch signal and inverts a signal value of the Nth switch signal. A signal representing a signal value obtained by inverting the signal value of the Nth switch signal is referred to as an Nth inverted signal. In this description, N is an integer greater than or equal to 1.

The switch control circuit 100 includes a plurality of AND circuits including a second AND circuit 152 and a third AND circuit 153. Note, however, that when the plurality of switches included in the switch control circuit 100 are two switches: the first switch 121 and the second switch 122, the AND circuit included in the switch control circuit 100 is one AND circuit: the second AND circuit 152.

The second AND circuit 152 accepts, as input, the first inverted signal and the second output signal and outputs a second switch signal that controls the second switch 122. The second switch signal represents a signal value that is an AND of a signal value of the input first inverted signal and a signal value of the input second output signal.

The third AND circuit 153 accepts, as input, the second inverted signal and the third output signal and outputs a third switch signal that controls the third switch 123. The third switch signal represents a signal value that is an AND of a signal value of the input second inverted signal and a signal value of the input third output signal.

An Nth AND circuit accepts, as input, an (N−1)th inverted signal and the Nth output signal and outputs an Nth switch signal that controls an Nth switch. The Nth switch signal represents a signal value that is an AND of a signal value of the input (N−1)th inverted signal and a signal value of the input Nth output signal. In this description, N is an integer greater than or equal to 2.

The switch control circuit 100 includes a plurality of input signal lines including a first input signal line 181, a second input signal line 182, and a third input signal line 183. Note, however, that when the plurality of switches included in the switch control circuit 100 are two switches: the first switch 121 and the second switch 122, the plurality of input signal lines included in the switch control circuit 100 are two input signal lines: the first input signal line 181 and the second input signal line 182.

The first input signal line 181 is a signal line to which a first individual signal is input.

The second input signal line 182 is a signal line to which a second individual signal is input.

The third input signal line 183 is a signal line to which a third individual signal is input.

An Nth input signal line is a signal line to which an Nth individual signal is input. In this description, N is an integer greater than or equal to 1.

The switch control circuit 100 includes a plurality of input amplifiers including a first input amplifier 111, a second input amplifier 112, and a third input amplifier 113. Note, however, that when the plurality of switches included in the switch control circuit 100 are two switches: the first switch 121 and the second switch 122, the plurality of input amplifiers included in the switch control circuit 100 are two input amplifiers: the first input amplifier 111 and the second input amplifier 112.

The first input amplifier 111 amplifies the first individual signal flowing through the first input signal line 181.

The second input amplifier 112 amplifies the second individual signal flowing through the second input signal line 182.

The third input amplifier 113 amplifies the third individual signal flowing through the third input signal line 183.

An Nth input amplifier amplifies the Nth individual signal flowing through the Nth input signal line. In this description, N is an integer greater than or equal to 1.

The switch control circuit 100 includes an output signal line 190 and an output amplifier 191.

The output signal line 190 is a signal line that outputs an output individual signal.

The output amplifier 191 amplifies the output individual signal flowing through the output signal line 190.

The switch control circuit 100 includes a plurality of channels including a first channel 101, a second channel 102, and a third channel 103. Note, however, that when the plurality of switches included in the switch control circuit 100 are two switches: the first switch 121 and the second switch 122, the plurality of channels included in the switch control circuit 100 are two channels: the first channel 101 and the second channel 102.

The first channel 101 includes the first input signal line 181, the first input amplifier 111, the first switch 121, and the first flip-flop 131, and composes a signal path through which the first individual signal flows.

The second channel 102 includes the second input signal line 182, the second input amplifier 112, the second switch 122, and the second flip-flop 132, and composes a signal path through which the second individual signal flows.

The third channel 103 includes the third input signal line 183, the third input amplifier 113, the third switch 123, and the third flip-flop 133, and composes a signal path through which the third individual signal flows.

An Nth channel includes the Nth input signal line, the Nth input amplifier, the Nth switch, and the Nth flip-flop, and composes a signal path through which the Nth individual signal flows. In this description, N is an integer greater than or equal to 1.

*Description of Operation*

Figure 2:
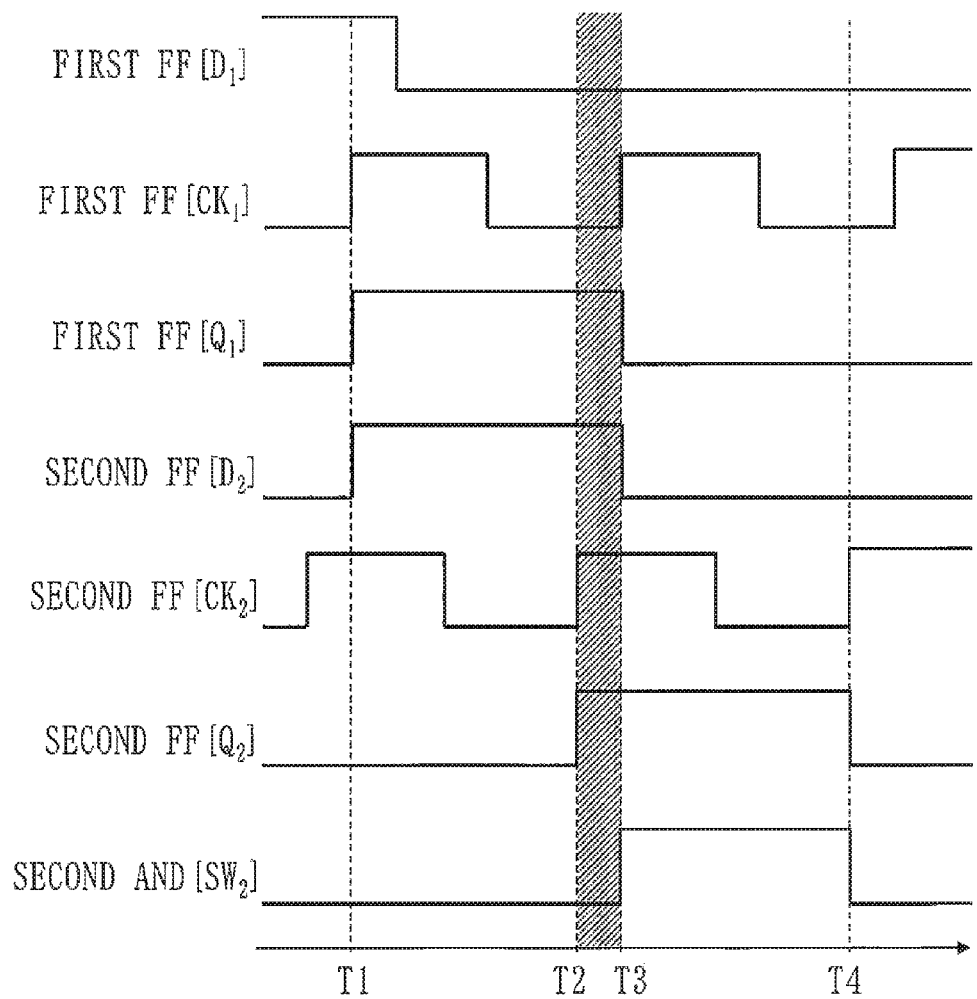
FIG. 2 is a timing diagram of a switch control circuit 100 of the first embodiment.
Figure 3:
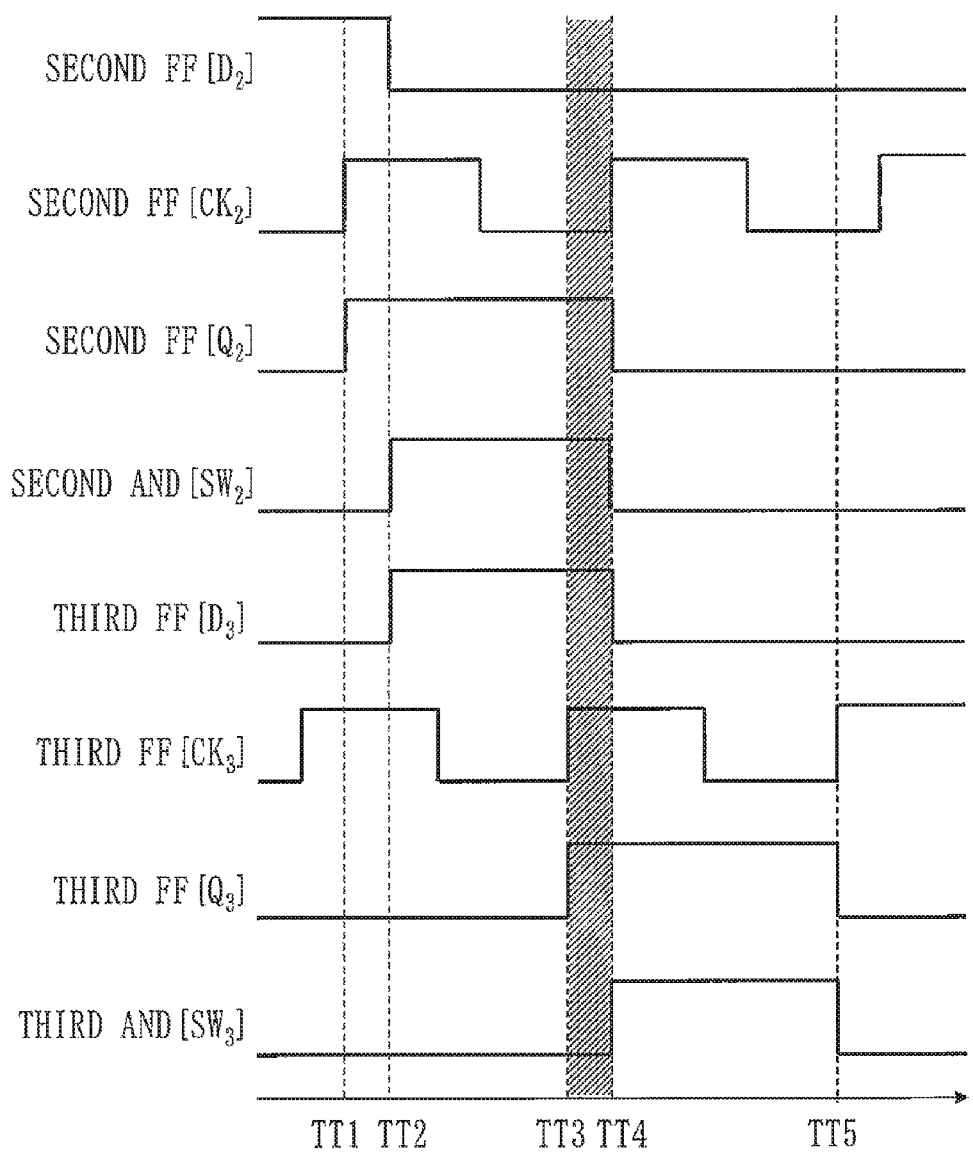
FIG. 3 is a timing diagram of the switch control circuit 100 of the first embodiment.

FIGS. 2 and 3 are timing diagrams of the switch control circuit 100 of the first embodiment.

The operation of the switch control circuit 100 of the first embodiment will be described based on FIGS. 2 and 3.

Representations shown in FIG. 2 indicate as follows:

A first FF indicates the first flip-flop 131. [$D_1$] indicates a trigger signal which is an input signal to be input to the $D_1$ terminal of the first flip-flop 131. [$CK_1$] indicates a first clock signal which is a clock signal to be input to the $CK_1$ terminal of the first flip-flop 131. [$Q_1$] indicates a first switch signal which is an output signal to be output from the $Q_1$ terminal of the first flip-flop 131.

A second FF indicates the second flip-flop 132. [$D_2$] indicates the first switch signal which is an input signal to be input to the $D_2$ terminal of the second flip-flop 132. [$CK_2$] indicates a second clock signal which is an input signal to be input to the $CK_2$ terminal of the second flip-flop 132. [$Q_2$] indicates a second output signal which is an output signal to be output from the $Q_2$ terminal of the second flip-flop 132.

A second AND indicates the second AND circuit 152. [$SW_2$] indicates a second switch signal which is a switch signal to be output from the second AND circuit 152.

In FIG. 2, the operation of the first channel 101 and the second channel 102 will be described.

The first switch signal [$Q_1$] output from the first flip-flop 131 is in the high state during a period from T1 to T3. T1 is timing at which the first clock signal [$CK_1$] rises with the trigger signal [$D_1$] being in the high state. T3 is timing at which the first clock signal [$CK_1$] rises with the trigger signal [$D_1$] being in the low state.

The first switch 121 is in an on state during a period from T1 to T3 where the first switch signal [$Q_1$] is in the high state.

The second output signal [$Q_2$] output from the second flip-flop 132 is in the high state during a period from T2 to T4. T2 is timing at which the second clock signal [$CK_2$] rises with the first switch signal [$D_2$] being in the high state. T4 is timing at which the second clock signal [$CK_2$] rises with the first switch signal [$D_2$] being in the low state.

The second switch signal [$SW_2$] output from the second AND circuit 152 is in the high state during a period from T3 to T4. In addition, the second switch signal [$SW_2$] is in the low state during a period from T1 to T3 where the first switch signal [$Q_1$] is in the high state.

The second switch 122 is in an on state during a period from T3 to T4 where the second switch signal [$SW_2$] is in the high state. In addition, the second switch 122 is in an off state during a period from T1 to T3 where the first switch 121 is in an on state.

By the operation described based on FIG. 2, the switch control circuit 100 can prevent the second switch 122 from going into an on state simultaneously with the first switch 121, without the second clock signal [$CK_2$] synchronizing with the first clock signal [$CK_1$].

Representations shown in FIG. 3 indicate as follows:

A second FF indicates the second flip-flop 132. [$D_2$] indicates a first switch signal which is an input signal to be input to the $D_2$ terminal of the second flip-flop 132. [$CK_2$] indicates a second clock signal which is an input signal to be input to the $CK_2$ terminal of the second flip-flop 132. [$Q_2$] indicates a second output signal which is an output signal to be output from the $Q_2$ terminal of the second flip-flop 132.

A second AND indicates the second AND circuit 152. [$SW_2$] indicates a second switch signal which is a switch signal to be output from the second AND circuit 152.

A third FF indicates the third flip-flop 133. [$D_3$] indicates the second switch signal which is an input signal to be input to the $D_3$ terminal of the third flip-flop 133. [$CK_3$] indicates a third clock signal which is an input signal to be input to the $CK_3$ terminal of the third flip-flop 133. [$Q_3$] indicates a third output signal which is an output signal to be output from the $Q_3$ terminal of the third flip-flop 133.

A third AND indicates the third AND circuit 153. [$SW_3$] indicates a third switch signal which is a switch signal to be output from the third AND circuit 153.

In FIG. 3, the operation of the second channel 102 and the third channel 103 will be described.

The second output signal [$Q_2$] output from the second flip-flop 132 is in the high state during a period from TT1 to TT4. TT2 is timing at which the second clock signal [$CK_2$] rises with the first switch signal [$D_2$] being in the high state. TT4 is timing at which the second clock signal [$CK_2$] rises with the first switch signal [$D_2$] being in the low state.

The second switch signal [$SW_2$] output from the second AND circuit 152 is in the high state during a period from TT2 to TT4. TT2 is timing at which the first switch signal [$D_2$] transitions from the high state to the low state with the second output signal [$Q_2$] being in the high state.

The second switch 122 is in an on state during a period from 172 to TT4 where the second switch signal [$SW_2$] is in the high state.

The third output signal [$Q_3$] output from the third flip-flop 133 is in the high state during a period from TT3 to TT5. TT3 is timing at which the third clock signal [$CK_3$] rises with the second switch signal [$D_3$] being in the high state. TT5 is timing at which the third clock signal [$CK_3$] rises with the second switch signal [$D_3$] being in the low state.

The third switch signal [$SW_3$] output from the third AND circuit 153 is in the high state during a period from TT4 to TT5. In addition, the third switch signal [$SW_3$] is in the low state during a period from TT2 to TT4 where the second switch signal [$SW_2$] is in the high state.

The third switch 123 is in an on state during a period from TT4 to TT5 where the third switch signal [$SW_3$] is in the high state. In addition, the third switch 123 is in an off state during a period from TT2 to TT4 where the second switch 122 is in an on state.

By the operation described based on FIG. 3, the switch control circuit 100 can prevent the third switch 123 from going into an on state simultaneously with the second switch 122, without the third clock signal [$CK_3$] synchronizing with the second clock signal [$CK_2$].

For N being an integer greater than or equal to 3, the operation of an (N−1)th channel and an Nth channel is the same as the operation of the second channel 102 and the third channel 103.

That is, the switch control circuit 100 can prevent an Nth switch from going into an on state simultaneously with an (N−1)th switch, without an Nth clock signal [$CK_N$] synchronizing with an (N−1)th clock signal [$CK_{N-1}$].

*Description of Advantageous Effects*

By the first embodiment, for example, advantageous effects such as those shown below are provided.

The switch control circuit 100 can control a plurality of switches such that the plurality of switches do not simultaneously go into an on state.

By this, collisions of sensor signals, response time degradation, and oscillation of the output amplifier 191 are suppressed and accordingly the magnetic ink reading apparatus 200 can be allowed to operate stably.

Second Embodiment

A mode will be described in which complementary switches which are controlled by a switch signal and an inverted signal are used.

Matters that differ from the first embodiment will be mainly described below. Matters whose description is omitted are the same as those in the first embodiment.

*Description of a Configuration*

Figure 4:
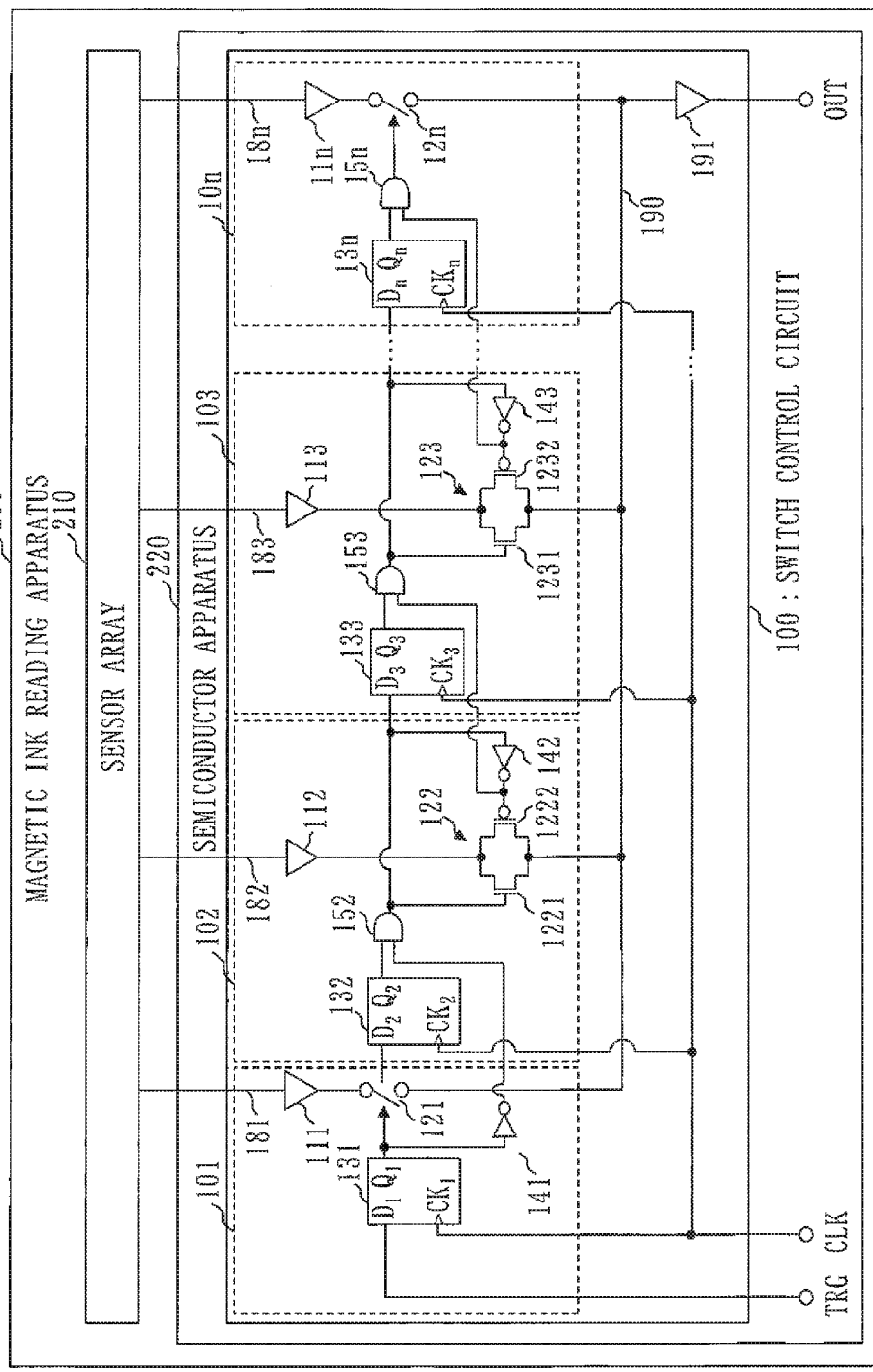
FIG. 4 is a configuration diagram of a magnetic ink reading apparatus 200 of a second embodiment.

FIG. 4 is a configuration diagram of a magnetic ink reading apparatus 200 of a second embodiment.

A configuration of the magnetic ink reading apparatus 200 of the second embodiment will be described based on FIG. 4. Note, however, that the configuration of the magnetic ink reading apparatus 200 does not need to be the same as that shown in FIG. 4.

The configuration of the magnetic ink reading apparatus 200 is the same as that described based on FIG. 1 in the first embodiment.

Note, however, that a configuration of a plurality of switches in a switch control circuit 100 included in the magnetic ink reading apparatus 200 partly differs from that of the first embodiment. The configuration of the plurality of switches will be described below.

The switch control circuit 100 includes a plurality of switches including a first switch 121, a second switch 122, and a third switch 123.

The first switch 121 is controlled by a first switch signal which is an output signal to be output from a first flip-flop 131.

An nth switch 12n is controlled by an nth switch signal to be output from an nth AND circuit 15n. The "n" of the nth switch 12n is a value representing the number of switches included in the switch control circuit 100.

The first switch 121 and the nth switch 12n may be complementary switches, as with other switches.

Other switches are complementary switches which are controlled by a switch signal and an inverted signal.

The second switch 122 is a complementary switch. The second switch 122 accepts, as input, a second switch signal and a second inverted signal. The second inverted signal represents a signal value obtained by inverting a signal value of the second switch signal.

The second switch 122 goes into an on state when the signal value of the input second switch signal is a signal value indicating "on" and the signal value of the input second inverted signal is a signal value indicating "off". For example, the signal value of the high-state switch signal indicates "on", and the signal value of the low-state switch signal indicates "off".

The second switch 122 includes a second switch signal input portion 1221 to which the second switch signal is input; and a second inverted signal input portion 1222 to which the second inverted signal is input.

The second switch signal input portion 1221 is composed of an NMOS, and the second inverted signal input portion 1222 is composed of a PMOS. The NMOS is an abbreviation for Negative MOS, and the PMOS is an abbreviation for Positive MOS. The MOS is an abbreviation for Metal Oxide Semiconductor.

The third switch 123 is a complementary switch. The third switch 123 accepts, as input, a third switch signal and a third inverted signal. The third inverted signal represents a signal value obtained by inverting a signal value of the third switch signal. The third inverted signal is generated by a third inverting circuit 143.

The third switch 123 goes into an on state when the signal value of the input third switch signal is a signal value indicating "on" and the signal value of the input third inverted signal is a signal value indicating "off".

The third switch 123 includes a third switch signal input portion 1231 to which the third switch signal is input; and a third inverted signal input portion 1232 to which the third inverted signal is input.

The third switch signal input portion 1231 is composed of an NMOS, and the third inverted signal input portion 1232 is composed of a PMOS.

A configuration of the switch control circuit 100 other than the plurality of switches is the same as that of the first embodiment. That is, the switch control circuit 100 includes a plurality of channels.

*Description of Operation*

Operation of the plurality of channels is the same as that described based on FIGS. 2 and 3 in the first embodiment.

Therefore, switches in respective two or more channels can be prevented from simultaneously going into an on state without synchronization between clock signals that are input to flip-flops in a respective plurality of channels.

*Description of Advantageous Effects*

As with the first embodiment, the switch control circuit 100 can control a plurality of switches such that the plurality of switches do not simultaneously go into an on state.

In the switch control circuit 100, an inverted signal to be input to a complementary switch is also input to an AND circuit. Hence, the switch control circuit 100 does not need to include an inverting circuit for the AND circuit, in addition to an inverting circuit for the complementary switch. Therefore, an increase in the circuit area of the switch control circuit 100 can be suppressed.

Third Embodiment

A mode will be described in which an Nth switch signal is generated based on an (N−1)th inverted signal obtained by inverting an (N−1)th output signal and on an Nth output signal. In a third embodiment, N is an integer greater than or equal to 2.

Matters that differ from the first embodiment will be mainly described below. Matters whose description is omitted are the same as those in the first embodiment.

*Description of a Configuration*

Figure 5:
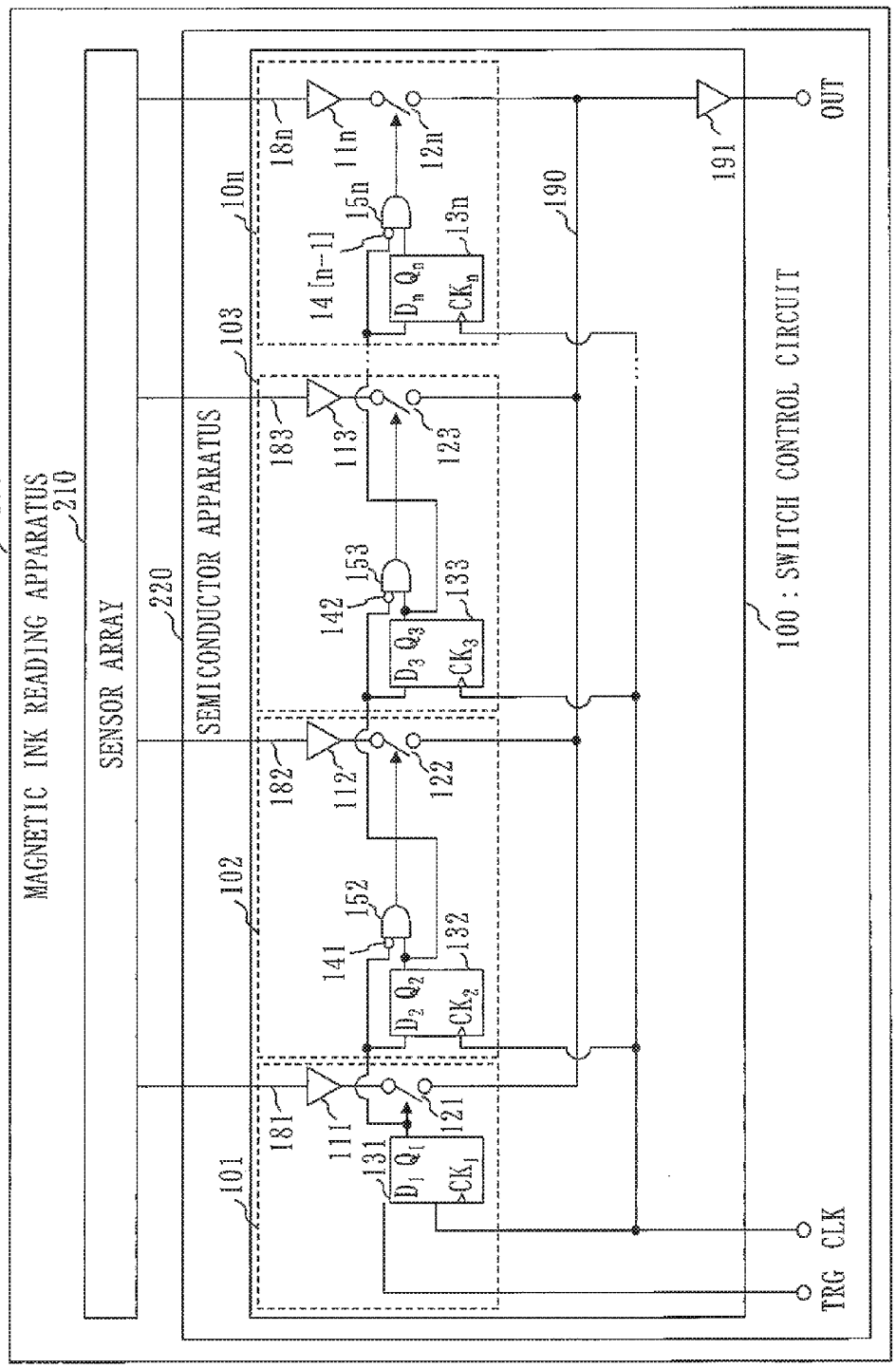
FIG. 5 is a configuration diagram of a magnetic ink reading apparatus 200 of a third embodiment.

FIG. 5 is a configuration diagram of a magnetic ink reading apparatus 200 of the third embodiment.

A configuration of the magnetic ink reading apparatus 200 of the third embodiment will be described based on FIG. 5.

Note, however, that the configuration of the magnetic ink reading apparatus 200 does not need to be the same as that shown in FIG. 5.

The configuration of the magnetic ink reading apparatus 200 is the same as that described based on FIG. 1 in the first embodiment.

Note, however, that a switch control circuit 100 included in the magnetic ink reading apparatus 200 generates an Nth switch signal based on an (N−1)th inverted signal obtained by inverting an (N−1)th output signal and on an Nth output signal. The generation of the Nth switch signal will be described below.

The switch control circuit 100 includes a plurality of switches including a third switch 123; a plurality of flip-flops including a third flip-flop 133; and a plurality of AND circuits including a third AND circuit 153.

The third flip-flop 133 accepts, as input, a clock signal and a second output signal, and outputs a third output signal based on a signal value of the input clock signal and a signal value of the input second output signal.

The third AND circuit 153 accepts, as input, a second inverted signal and the third output signal, and outputs a third switch signal that controls the third switch 123. The second inverted signal represents a signal value obtained by inverting a signal value of the second output signal. The third switch signal represents a signal value that is an AND of a signal value of the input second inverted signal and a signal value of the input third output signal.

An Nth AND circuit accepts, as input, an (N−1)th inverted signal and an Nth output signal, and outputs an Nth switch signal that controls an Nth switch. The (N−1)th inverted signal represents a signal value obtained by inverting a signal value of an (N−1)th output signal. The Nth switch signal represents a signal value that is an AND of a signal value of the input (N−1)th inverted signal and a signal value of the input Nth output signal. In this description, N is an integer greater than or equal to 2.

*Description of Operation*

Figure 6:
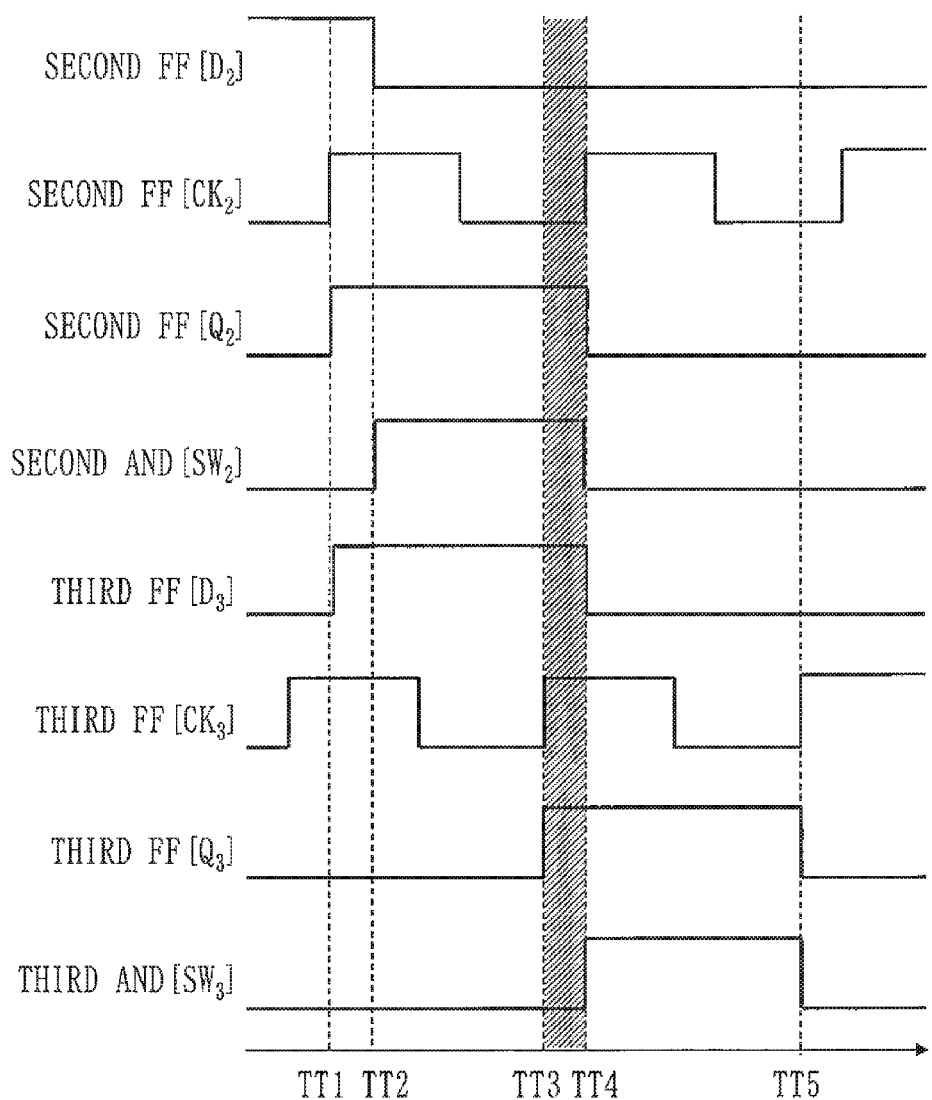
FIG. 6 is a timing diagram of a switch control circuit 100 of the third embodiment.

FIG. 6 is a timing diagram of the switch control circuit 100 of the third embodiment.

The operation of the switch control circuit 100 of the third embodiment will be described based on FIG. 6.

In FIG. 6, the operation of a second channel 102 and a third channel 103 is the same as that described based on FIG. 3 in the first embodiment. Note, however, that [D$_3$] indicates a second output signal which is an input signal to be input to a D$_3$ terminal of the third flip-flop 133.

For N being an integer greater than or equal to 3, the operation of an (N−1)th channel and an Nth channel is the same as that of the second channel 102 and the third channel 103.

That is, the switch control circuit 100 can prevent an Nth switch from going into an on state simultaneously with an (N−1)th switch, without an Nth clock signal [CK$_N$] synchronizing with an (N−1)th clock signal [CK$_{N-1}$].

The operation of a first channel 101 and the second channel 102 is the same as that described based on FIG. 2 in the first embodiment.

That is, the switch control circuit 100 can prevent a second switch 122 from going into an on state simultaneously with a first switch 121, without a second clock signal [CK$_2$] synchronizing with a first clock signal [CK$_1$].

*Description of Advantageous Effects*

As with the first embodiment, the switch control circuit 100 can control a plurality of switches such that the plurality of switches do not simultaneously go into an on state.

In addition, since a signal path for a switch signal is separated from a signal path between flip-flops, the switch control circuit 100 can more rapidly switch a switch to be placed in an on state.

Each embodiment is an example of a mode of the switch control circuit 100.

That is, the switch control circuit 100 does not need to include some of the components described in each embodiment. In addition, the switch control circuit 100 may include components that are not described in each embodiment. Furthermore, the switch control circuit 100 may be one obtained by combining together some or all of the components of the embodiments.

The operation described using the timing diagrams, etc., in each embodiment is an example of operation for a method according to each embodiment. The method according to each embodiment may be implemented by operation that partly differs from that described in each embodiment.

REFERENCE SIGNS LIST

100: switch control circuit, 101: first channel, 102: second channel, 103: third channel, 111: first input amplifier, 112: second input amplifier, 113: third input amplifier, 121: first switch, 122: second switch, 123: third switch, 131: first flip-flop, 132: second flip-flop, 133: third flip-flop, 141: first inverting circuit, 142: second inverting circuit, 143: third inverting circuit, 152: second AND circuit, 153: third AND circuit, 181: first input signal line, 182: second input signal line, 183: third input signal line, 190: output signal line, 191: output amplifier, 200: magnetic ink reading apparatus, 210: sensor array, 220: semiconductor apparatus

The invention claimed is:

1. A switch control circuit comprising:
a first switch;
a second switch;
a first flip-flop to output a first output signal as a first switch signal, the first switch signal controlling the first switch;
a second flip-flop to accept, as input, a clock signal and the first output signal and output a second output signal based on a signal value of the input clock signal and a signal value of the first output signal; and
a second AND circuit to accept, as input, a first inverted signal and the second output signal and output, as a second switch signal, a signal representing a signal value that is an AND of a signal value of the first inverted signal and a signal value of the second output signal, the first inverted signal representing a signal value obtained by inverting the signal value of the first output signal, and the second switch signal controlling the second switch.

2. The switch control circuit according to claim 1, comprising:
a third switch;
a third flip-flop to accept, as input, the clock signal and the second switch signal and output a third output signal based on a signal value of the input clock signal and a signal value of the second switch signal; and
a third AND circuit to accept, as input, a second inverted signal and the third output signal and output, as a third switch signal, a signal representing a signal value that is an AND of a signal value of the second inverted signal and a signal value of the third output signal, the second inverted signal representing a signal value obtained by inverting the signal value of the second switch signal, and the third switch signal controlling the third switch.

3. The switch control circuit according to claim 2, wherein the third switch is a complementary switch to accept, as input, the third switch signal and a third inverted signal and goes into an on state when a signal value of the third switch signal is a signal value indicating "on" and a signal value of the third inverted signal is a signal value indicating "off", the third inverted signal representing a signal value obtained by inverting a signal value of the third switch signal.

4. The switch control circuit according to claim 1, comprising:
a third switch;
a third flip-flop to accept, as input, the clock signal and the second output signal and output a third output signal based on a signal value of the input clock signal and a signal value of the second output signal; and
a third AND circuit to accept, as input, a second inverted signal and the third output signal and output, as a third switch signal, a signal representing a signal value that is an AND of a signal value of the second inverted signal and a signal value of the third output signal, the second inverted signal representing a signal value obtained by inverting the signal value of the second output signal, and the third switch signal controlling the third switch.

5. A semiconductor apparatus comprising the switch control circuit according to claim 1.

6. A magnetic ink reading apparatus comprising the switch control circuit according to claim 1.

* * * * *